United States Patent [19]
Jasper

[11] Patent Number: 5,263,196
[45] Date of Patent: Nov. 16, 1993

[54] METHOD AND APPARATUS FOR COMPENSATION OF IMBALANCE IN ZERO-IF DOWNCONVERTERS

[75] Inventor: Steven C. Jasper, Hoffman Estates, Ill.

[73] Assignee: Motorola, Inc., Schaumburg, Ill.

[21] Appl. No.: 615,107

[22] Filed: Nov. 19, 1990

[51] Int. Cl.$^5$ .............................................. H04B 1/26
[52] U.S. Cl. .................... 455/324; 455/239.1; 455/245.1; 455/305; 455/337; 375/98; 375/102
[58] Field of Search ................ 455/60, 305, 312, 324, 455/337, 245.1, 239.1, 295; 370/20; 375/77, 97, 98, 102

[56] References Cited

U.S. PATENT DOCUMENTS

| | | | |
|---|---|---|---|
| 4,631,489 | 12/1986 | Laird et al. | 329/110 |
| 4,631,738 | 12/1986 | Betts et al. | 375/98 |
| 4,677,690 | 6/1987 | Reed | 455/324 X |
| 4,691,377 | 9/1987 | Yoshihara et al. | |
| 4,712,222 | 12/1987 | Heard et al. | 375/77 |
| 4,733,403 | 3/1988 | Simone | |
| 4,736,390 | 4/1988 | Ward et al. | 455/324 X |
| 4,757,502 | 7/1988 | Goldman | |
| 4,933,986 | 6/1990 | Leitch | |
| 5,083,304 | 1/1992 | Cahill | 375/98 |

*Primary Examiner*—Reinhard J. Eisenzopf
*Assistant Examiner*—Chi Pham
*Attorney, Agent, or Firm*—Susan L. Lukasik; Raymond A. Jenski; Steven G. Parmelee

[57] ABSTRACT

To compensate the audio distortion resulting from amplitude and phase imbalance in the quadrature oscillator (103) and mixers (105, 115) in zero-IF downconverters (203), a balancing action is required. An apparatus for distortion compensation compensates for the amplitude and phase imbalance to reduce audio distortion. This is accomplished by determining (309) two gain values, which are combined (217, 227, 229) with the in-phase and quadrature components of the zero-IF downconverter (203) to compensate for the imbalance.

24 Claims, 4 Drawing Sheets

METHOD AND APPARATUS FOR COMPENSATION OF IMBALANCE IN ZERO-IF DOWNCONVERTERS

FIELD OF THE INVENTION

This invention is concerned with intermediate frequency circuits for radio receivers. More particularly, this invention is concerned with intermediate frequency circuits where the intermediate frequency is zero Hertz.

BACKGROUND OF THE INVENTION

Traditionally, intermediate frequency (IF) sections have been employed in receivers to perform the major portion of a radio's selectivity since it may be technically difficult or cost prohibitive to develop sufficiently selective filters at the received frequency. The process of translating a signal down to zero Hertz intermediate frequency is known as zero-IF downconversion.

One of the problems associated with implementation of zero-IF downconverters is that of amplitude and phase imbalance in the quadrature oscillator and mixers. This results in audio distortion. FIG. 1A shows a simple model of a zero-IF circuit, which takes a real input signal $Re\{x(t)e^{j\omega t}\}$ at 101, centered at radian frequency $\omega$, and translates the signal to zero Hertz, producing the complex signal $x(t)$. The circuit mixes the input signal separately by $\cos(\omega t)$ and $\sin(\omega t)$, and does lowpass filtering to remove double-frequency components, noise, and adjacent interfering signals.

Ideally, the two outputs comprise the real component $R_0$ at node 109 and imaginary component $I_0$ at node 119 of the desired output signal $x(t)$. If there is a phase imbalance in the quadrature oscillator, or an amplitude imbalance in the oscillator 103, mixers 105, 115 or lowpass filters 107, 117, then a distortion component proportional to $x^*(t)$, the complex conjugate of $x(t)$, also appears. If the imbalance is molded (without loss of generality) by taking the oscillator outputs to be $\cos(\omega t)$ at 105 and a $\sin(\omega t + \phi)$ at 115, the outputs at node 121 (after the imaginary part $I_0$ at node 119 is scaled at 111 by $j=\sqrt{-1}$ and that product added at 113 to the real part $R_0$ at node 109) is $$R_0 + jI_0 = x(t)\{1 + ae^{-j\phi}\}/2 + x^*(t)\{1 - ae^{j\phi}\}/2.$$

When $a=1$ and $\phi=0$, there is no distortion. Otherwise there is an $x^*(t)$ distortion term with distortion-to-signal power ratio of approximately $D/S = |1-ae^{j\phi}|^2/4$. As an example, to achieve at least a 40 dB D/S ratio, 'a' must be between 0.98 and 1.02, and the phase error '$\phi$' must be less than 1.15 degrees.

The distortion created by this imbalance can cause audio distortion in FM reception, and a bit error rate floor in digital systems. These problems might be especially severe, for example, in FM stereo applications or with very highly spectral efficient digital modulation such as 256 Quadrature AM. An even more stringent application in terms of balancing requirements is the FDM (Frequency-Division-Multiplexing) channel bank, where the input signal consists of a number of narrow-band signals which are to be separated and demodulated. The spectrum of the $x^*(t)$ interference term is a frequency-inverted version of the desired $x(t)$ spectrum, scaled by the D/S ratio. If the narrow-band signals exhibit a dynamic range on the order of at least the D/S ratio, then reception can be severely degraded. A large dynamic range can result from frequency-selective fading of a single FDM signal arriving from one transmitter, or an FDM signal comprising a number of narrow-band signals arriving from different transmitters.

To date, quadrature balance is best achieved by implementing the zero-IF downconverter on a single integrated circuit, so that the parameters affecting the oscillator phasing and the gain matching between real and imaginary paths may be accurately controlled. Good circuit design can result in D/S ratios of 30 dB or so, which is inadequate for some applications, such as those indicated above. Therefore, the need exists for a way to improve quadrature balance.

DESCRIPTION OF A PREFERRED EMBODIMENT

A method and apparatus that provides an automatic means for compensation of the quadrature imbalance in a zero-IF downconverter is disclosed.

Figure 2A:
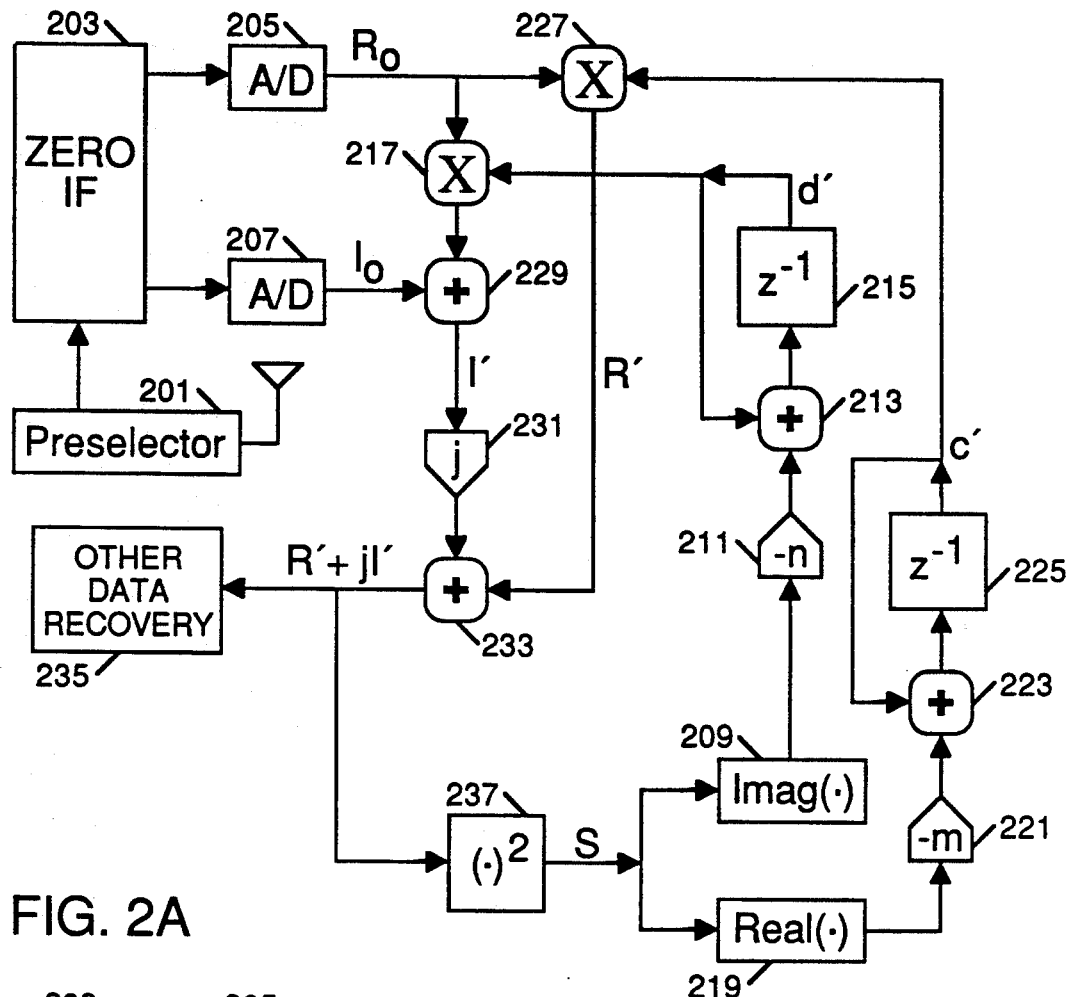
FIG. 2A is a block diagram of a radio receiver with a circuit for estimating gain values in accordance with the invention.
Figure 2C:
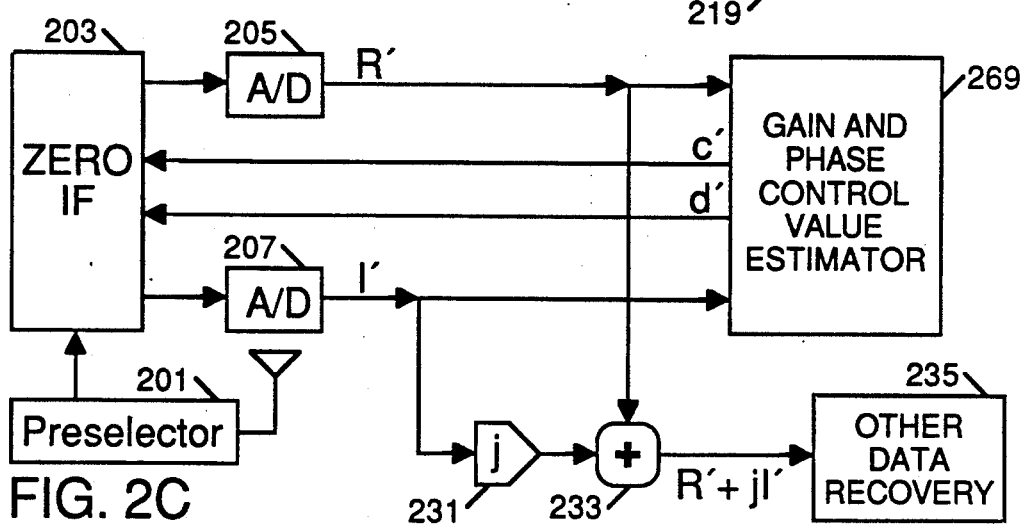
FIG. 2C is a block diagram of a radio receiver with estimating gain values fed back to the zero-IF converter in accordance with the invention.
Figure 2B:
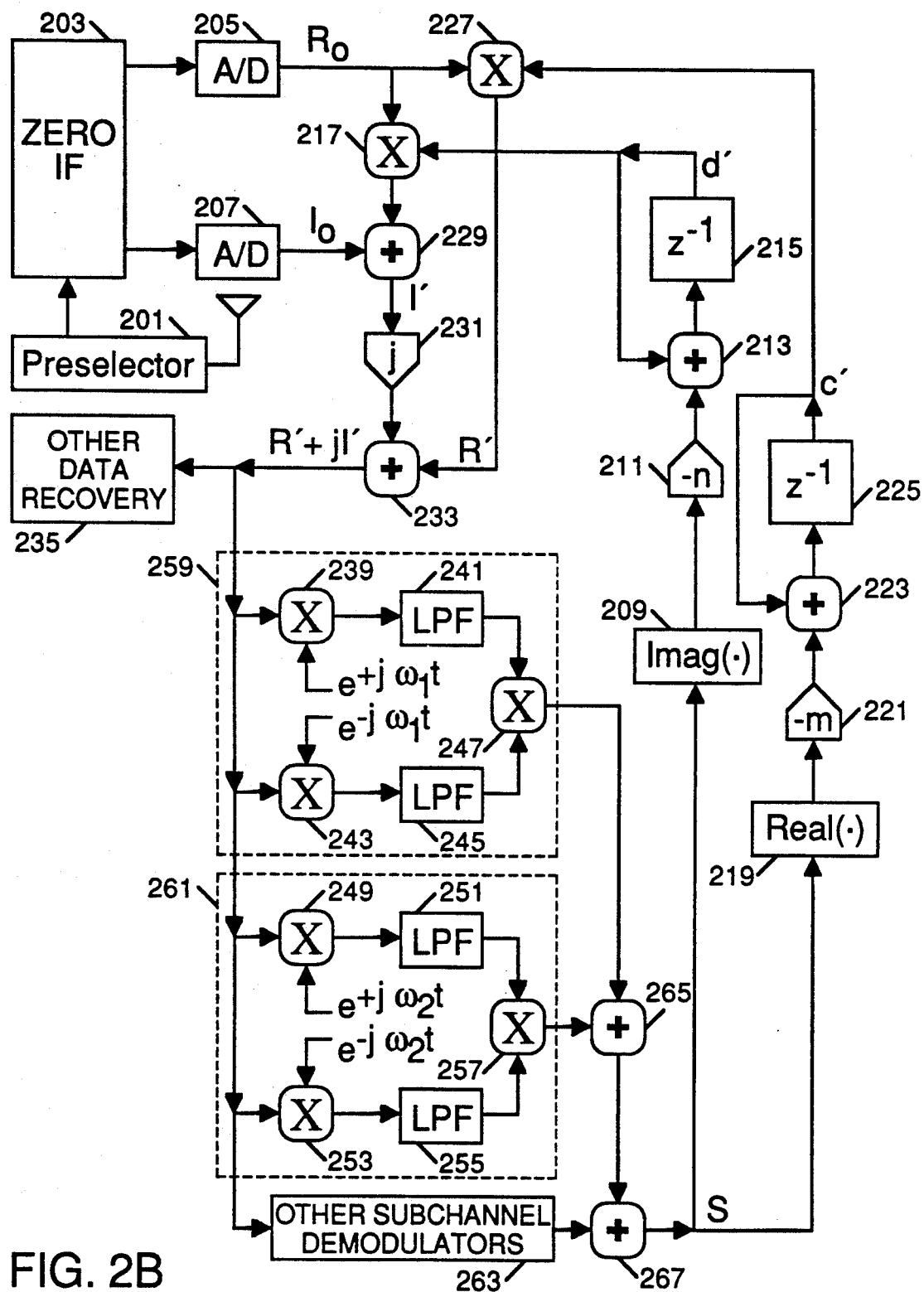
FIG. 2B is a block diagram of a radio receiver with a zero-IF imbalance compensator suitable for FDM signals in accordance with the invention.

Functionally, the invention consists of two parts: 1) the means for compensating for the imbalance, and 2) the means for controlling the compensator. Compensation can be effected by either directly modifying the quadrature phase and path gains in the zero-IF downconverter itself, or by the use of a separate compensator or balancer. The direct approach will be discussed later, in reference to FIG. 2C. The separate approach is illustrated in FIG. 2A and FIG. 2B.

Figure 1A:
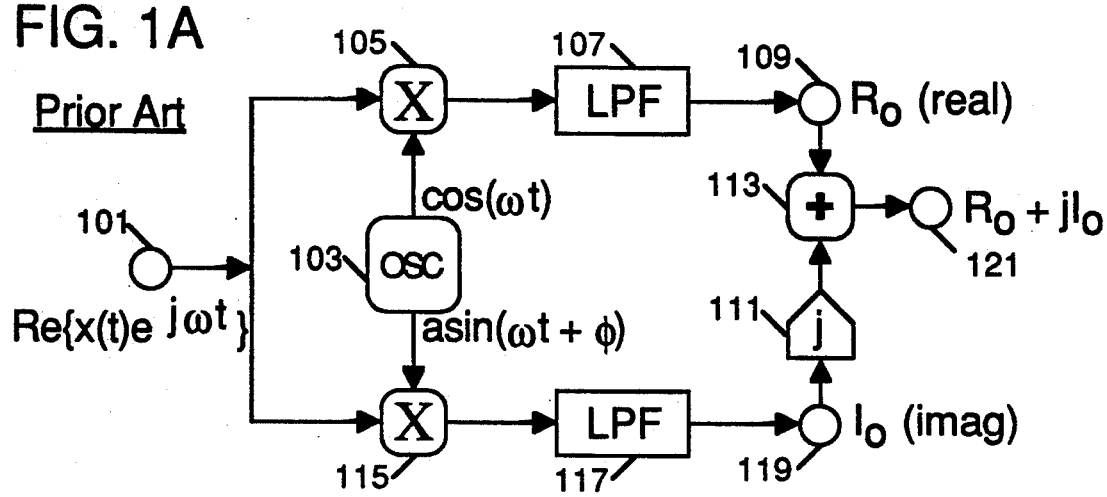
FIG. 1A is a simple model of a zero-IF circuit.
Figure 1B:
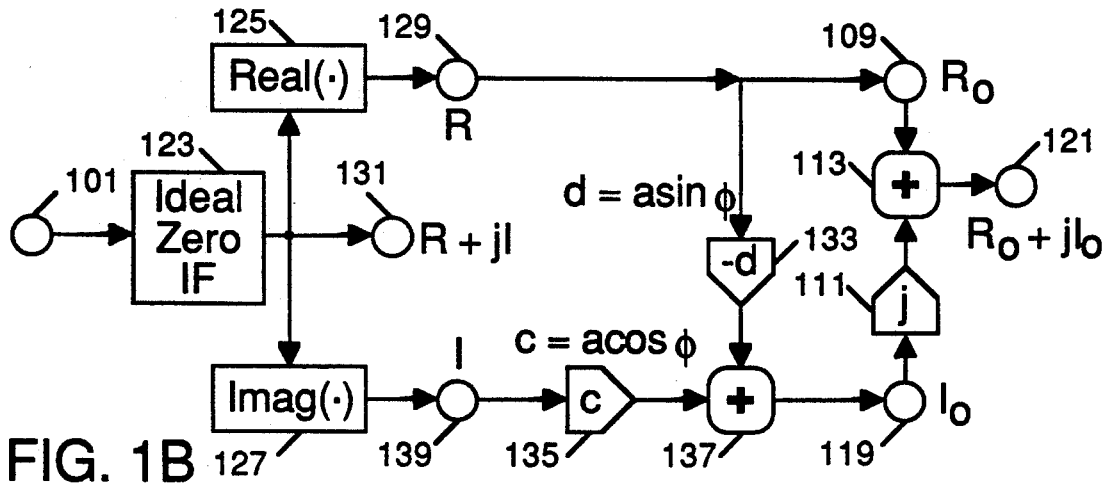
FIG. 1B is a model of the imbalancing action of the zero-IF circuit model of FIG. 1A in accordance with the invention.

FIG. 1B shows a model of the imbalancing action of the zero-IF circuit, following the assumptions and terminology of FIG. 1A. If an ideal zero-IF circuit 123 existed, it would produce, at node 131, $x(t) = R + jI$, the desired signal from the transmitter before modulation. Block 125 produces at node 129 the real part, R, of the desired signal. Block 127 produces at node 139 the imaginary part, I, of the desired signal. The model scales R at scaler 133 by a factor of $-d = -a \sin \phi$ and scales I at scaler 135 by a factor of $c = a \cos \phi$. The result of these two scalings is input to adder 137 producing $I_0$, also known as the quadrature, or imaginary, component of the signal, at node 119. R is passed straight through to node 109, yielding $R_0$, also known as the in-phase, or real, component of the signal. As in FIG. 1A, $I_0$ is scaled at scaler 111 by the factor j, and that product is added to $R_0$ at adder 113. The output of adder 113 produces the unbalanced zero-IF output at node 121, expressed as $$R_0 + jI_0 = R + j(Ia \cos \phi - Ra \sin \phi).$$

Figure 1C:
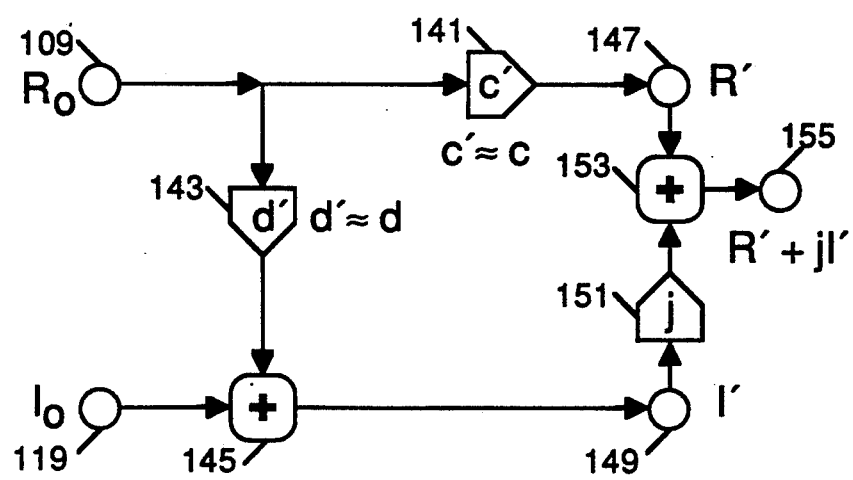
FIG. 1C is a model of a zero-IF circuit imbalance compensator in accordance with the invention.

The compensator or balancer model (and block diagram of the preferred embodiment of the invention) is shown in FIG. 1C. It operates on the zero-IF output signal $R_0+jI_0$ at nodes 109, 119. $R_0$ is scaled at scaler 141 by factor c' to produce R' at node 147. $R_0$ is scaled at scaler 143 by factor d' and that product is added to $I_0$ at adder 145 to form I' at node 149. I' is scaled at scaler 151 by j, and the resultant product is added to R' at adder 153, that sum forming at node 155

$$R'+jI'=c'R_0+j(I_0+d'R_0).$$

The output nodes 109, 119 of the zero-IF section of FIG. 1B are connected to the matching nodes of the input nodes 109, 119 of the balancer (distortion compensator) of FIG. 1C. Blocks 111 and 113 are not included in this cascade. The output of the cascade of the zero-IF section and balancer at node 155 is $$R'+jI'=cR+j[(d-d')R+c'I].$$

The zero-IF imbalance is compensated for if c'=c and d+=d, since in that case $$R'+jI'=c(R+jI),$$

and the original signal is recovered except for a scaling by c.

FIG. 2A is a block diagram of a radio receiver with a circuit for estimating gain values c' and d'. After a transmitted signal enters the preselector 201, its output is relayed to the zero-IF downconverter 203, where it is converted to a zero Hertz signal and split into real and imaginary parts. The real part is fed to a conventional A/D converter 205, the output of which is $R_0$. The imaginary part is fed to another conventional A/D converter 207, the output of which is $I_0$. $R_0$ is multiplied at mixer 227 by factor c', producing R'. $R_0$ is multiplied at mixer 217 by factor d', and that product is added to $I_0$ at adder 229, yielding I'. I' is scaled at scaler 231 by the factor j, the result of which is added to R' at adder 233, yielding the signal R'+jI', which is fed into block 235 where the rest of the data recovery is performed, including error correction, speech recovery, etc. The signal R'+jI' is also input to the complex squaring block 237. The real output, $R'^2-I'^2$, of complex squaring block 237 is stripped off by the real function block 219 and is scaled at scaler 221 by value −m, where m is a loop gain constant. The output of scaler 221 is input to adder 223, whose other input is the output feedback from accumulator 225, whose input is the output of adder 223. The output of accumulator 225 is c', which is fed to multiplier 227 producing R'. The imaginary output, 2R'I', of complex squaring block 237 is stripped off by the imaginary function block 209 and is scaled at scaler 211 by value −n, where n is also a loop gain constant. The output of scaler 211 is input to adder 213, whose other input is the output feedback from accumulator 215, whose input is the output of adder 213. The output of accumulator 215 is d', which is fed to multiplier 217, the output of which is used to form I'. In the preferred embodiment of the invention, all of the functions performed by the blocks in FIG. 2A (except blocks 201, 203, 205, and 207) are performed in a DSP (Digital Signal Processor), such as a DSP56001, available from Motorola, Inc. Although the preferred embodiment of the invention is performed in a digital format, it is possible to use equivalent analog components for an analog environment.

The acmmulator outputs, the estimated c' and d' values fed back to the appropriate adder, form a first-order control or estimation loop. The loop gain constants, m and n, control the acquisition speed and jitter performance of the estimation. The values of the loop gain constants are chosen to give the desired trade-off between acquisition speed and jitter for the particular receiver. Large values of m and n result in faster acquisition speed, but greater jitter in the c' and d' values from their nominal values. The issues of acquisition speed, jitter, and dependency of loop performance on signal level are common in the field of control loops, especially phase-locked loops, which are well understood in the art. Proper operation of the loop is dependent on there being no discrete spectral components in the balancer output signal which could give rise to a DC component upon squaring. Such components (e.g., DC offsets produced by the mixers or A/D converters) must be eliminated prior to the complex squaring operation. This may be accomplished by filtering the R'+jI' signal (in the case of DC offsets or carrier pilots), or by disabling the accumulators during certain time intervals (e.g., during periodic pilot pulses or synchronization patterns). Alternatively, the effect of discrete spectral components may be avoided through the use of an alternative form of the balancer as discussed below in connection with FIG. 2B.

It is easy to see the actual function blocks from FIG. 2A as they relate to the model in FIG. 1C. The balancer comprises blocks 209 through 237 inclusive except for block 235, hence blocks 141 through 155 inclusive in the model in FIG. 1C. Signal $R_0$, the output of the real A/D converter 205, appears at node 109. Signal $I_0$ at node 119 appears at the output of the imaginary A/D converter 207. Multipliers 217 and 227 perform the function of scalers 143 and 141, respectively, and scaler 231 performs the function of scaler 151. Adders 229 and 233 perform the adding function of blocks 145 and 153, respectively. Signal I' at node 149 is the output of adder 229, signal R' at node 147 is the output of multiplier 227, and signal R'+jI' at node 155 is the output of adder 233. Blocks 219, 221, 223, 225, and 237 provide calculation and control of the factor c', and blocks 209, 211, 213, 215, and 237 provide calculation and control of the factor d'.

An alternative from of the balancer is shown in FIG. 2B, which depicts a block diagram of a radio receiver with a zero-IF imbalance compensator suitable for FDM signals or signals with discrete spectral components. FIG. 2B is a modification of FIG. 2A to handle FDM signals, because FDM signals consist of a number of narrow-band signals which are to be separated and demodulated to zero Hertz. Blocks 201 through 233 inclusive perform as described above for FIG. 2A. Blocks 239 through 267 inclusive from FIG. 2B replace block 237 of FIG. 2A and perform a similar function, but necessarily adapted for FDM. Blocks 259, 261, and 263 are complex subchannel demodulator-pair processors, one demodulator to recover each frequency division of the (FDM) signal. Complex subchannel demodulator-pair processor 259 comprises blocks 239 through 247 inclusive. Mixers 239 and 243 take the balancer output signal, R'+jI', and mix it with the first frequency division subchannel carrier, $+\omega_1$ ($e^{j\omega_1 t}$) at mixer 239 and $-\omega_1$ ($e^{-j\omega_1 t}$) at mixer 243. The output of mixer 239 is passed through lowpass filter 241, and the output of mixer 243 is passed through lowpass filter 245. The outputs of lowpass filters 241 and 245 are multiplied together at 247. Complex subchannel demodulator-pair processor 261 performs similarly to block 259. Complex subchannel demodulator-pair processor 261 comprises blocks 249 through 257 inclusive. Mixers 249 and 253 take the balancer output signal, $R'+jI'$, and mix it with the second frequency division subchannel carrier, $+\omega_2(e^{j\omega_2 t})$ at mixer 249 and $-\omega_2(e^{-j\omega_2 t})$ at mixer 253. The output of mixer 249 is passed through lowpass filter 251, and the output of mixer 253 is passed through lowpass filter 255. The outputs of lowpass filters 251 and 255 are multiplied together at 257. The output of blocks 247 and 257 are added at 265, the output of which is added at 267 to the output of block 263, which represents the remainder, if any, of the complex subchannel demodulator-pair processors. The output of adder 267 is input to block 219, which strips off the real part and inputs it to scaler 221. The output of adder 267 is also input to block 209, which strips off the imaginary part and inputs it to scaler 211. Block 235 behaves as in FIG. 2A, but adapted for FDM signal recovery. The mixer frequencies, e.g., $+\omega_1, -\omega_1$, for each symmetric pair must be substantially negatives of each other in the complex subchannel demodulator-pair processors 259, 261, 263. The lowpass filters in each complex subchannel demodulator-pair processor 259, 261, 263 must be substantially identical. These requirements for frequency and lowpass filtering are facilitated through DSP implementation. The preferred embodiment of the balancer of FIG. 2B also resides in a DSP, i.e., all of the functions performed by the blocks in FIG. 2B, except blocks 201, 203, 205, and 207.

The preceding descriptions emphasized an implementation and the use of a separate balancer which compensates for the zero-IF imbalance after the fact, that is, after the damage has been done. The gain values $c'$ and $d'$ can be used to control the zero-IF directly, eliminating a separate balancer. Near the optimum balance point, $c'$ and $d'$ approach $a\cos\phi$ and $a\sin\phi$, respectively. Since $a \approx 1$, and $\phi \approx 0$, $c'$ and $d'$ are approximately $a$ and $\phi$, respectively. Hence, $c'$ can be used to control the gain in the imaginary path of the zero-IF circuit, and $d'$ to control the phase of the sine oscillator output. Referring to FIG. 2C, the only different block from FIG. 2B and FIG. 2C is gain and phase control value estimator 269. It is not really a new block, but grouping of blocks. It represents blocks 209, 211, 213, 215, 219, 221, 223, 225, and 233 from FIG. 2A or blocks 209, 211, 213, 215, 219, 221, 223, 225, and 239 through 267 inclusive from FIG. 2B. The gain control value $c'$ and the phase control value $d'$ are fed from gain and phase control value estimator 269 (after conversion to analog format in the preferred embodiment) to zero-IF downconverter 203, where $c'$ is used to control the gain in the imaginary path of the zero-IF circuit, and $d'$ is used to control the phase of the sine oscillator output. The output of A/D converter 205, $R'$, is fed directly into adder 233, and the output of A/D converter 207, $I'$, is fed directly into scaler 231, since compensation has already occurred within the zero-IF circuit 203 itself. For example, if the diagram of FIG. 1A is used to represent the zero-IF downconverter 203, a scaler block, scaling by value $c'$, is added in series between mixer 115 and lowpass filter 117 or between lowpass filter 117 and node 119. The value of $d'$ is introduced as phase compensation in the oscillator to the $a\sin(\omega t + \phi)$ component.

Figure 3:
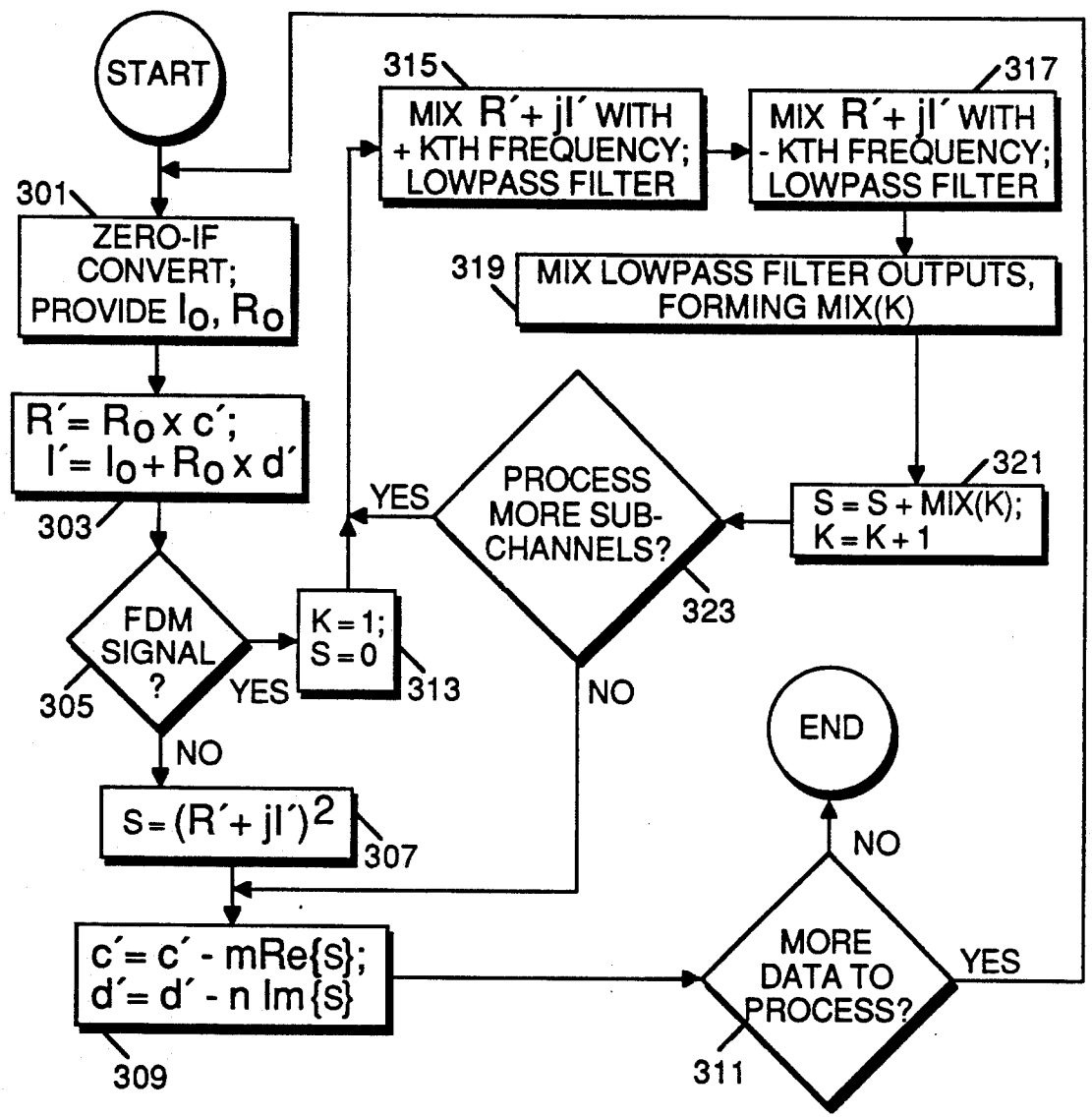
FIG. 3 is a flowchart of zero-IF conversion compensation in accordance with the invention.

FIG. 3 is a flowchart of zero-IF conversion compensation in accordance with the invention. The technique for zero-IF conversion compensation in the preferred embodiment of the invention shown in the flowchart proceeds as follows. The input signal from the receiver is converted to zero-IF, providing $R_0$ and $I_0$ at 301. $R'$ is formed by multiplying $R_0$ by $c'$ and $I'$ is formed by adding $I_0$ to $R_0$ multiplied by $d'$ at 303. If at 305 the signal is not FDM, or if subchannel demodulator pair type processing is not desired, the signal S is simply $(R'+jI')^2$ at 307. If at 305 the signal is FDM, or if subchannel demodulator pair type processing is desired, the value of S is determined as follows. K is set to 1 and S is set to 0 at 313. $R'+jI'$ is mixed with the $+K$th frequency (the first time through it is $+\omega_1$) and passed through a lowpass filter at 315. $R'+jI'$ is then mixed with the $-K$th frequency (the first time through it is $-\omega_1$) and passed through a lowpass filter at 317. The outputs of these lowpass filters are mixed, forming MIX(K) at 319. S is set to the previous value of S plus MIX(K) and K is incremented by 1 at 321. If there are more subchannels to process at 323, the process returns to step 315. If there are no more subchannels to process at 323, the current value of S is the final value for this pass through the procedure, which is now continued at block 309. The gain control value $c'$ is formed by taking the previous value of $c'$ and subtracting the product of m multiplied by the real part of S, and the phase control value $d'$ is formed by taking the previous value of $d'$ and subtracting the product of n multiplied by the imaginary part of S at 309, where m and n are the loop gain constants described previously. If there is more data to process at 311, the process is repeated from the beginning (step 311), otherwise it is complete.

What is claimed is:

1. A distortion compensator for phase and amplitude imbalance in zero-IF downconverters processing real and imaginary signal components, comprising:
    a first means for processing the real and imaginary signal components to produce a gain control value;
    a second means for processing the real and imaginary signal components to produce a phase control value; and
    means for coupling said gain and phase control values to the zero-IF downconverter, wherein said first means for processing further comprises:
    means for squaring a sum of the real and imaginary signal components, producing a squared real part and a squared imaginary part;
    means for scaling the squared real part by a first loop gain constant;
    means for adding said scaled squared real part to said gain control value, yielding a real squared sum; and
    means for accumulating said real squared sum, providing said gain control value.

2. A distortion compensator for phase and amplitude imbalance in zero-IF downconverters processing real and imaginary signal components, comprising:
    a first means for processing the real and imaginary signal components to produce a gain control value;
    a second means for processing the real and imaginary signal components to produce a phase control value; and
    means for coupling said gain and phase control values to the zero-IF downconverter, wherein said second means for processing further comprises:

means for squaring a sum of the real and imaginary signal components, producing a squared real part and a squared imaginary part;

means for scaling the squared imaginary part by a second loop gain constant;

means for adding said scaled squared imaginary part to said phase control value, yielding an imaginary squared sum; and means for accumulating said imaginary squared sum, providing said phase control value.

3. A distortion compensator for phase and amplitude imbalance in zero-IF downconverters processing real and imaginary signal components, comprising:

a first means for processing the real and imaginary signal components to produce a gain control value;

a second means for processing the real and imaginary signal components to produce a phase control value; and means for coupling said gain and phase control values to the zero-IF downconverter, wherein said first means for processing further comprises:

means for mixing the real and imaginary signal components with a first frequency carrier, producing a first mixed signal;

means for mixing the real and imaginary signal components with a negative of said first frequency carrier, producing a second mixed signal;

means for mixing said first mixed signal with said second mixed signal, resulting in a first mixed real part and a first mixed imaginary part;

means for scaling the first mixed real part by a first loop gain constant;

means for adding scaled first mixed real part to said gain control value, yielding a real mixed sum; and means for accumulating said real mixed sum, providing said gain control value;

and wherein said second means for processing further comprises:

means for mixing the real and imaginary signal components with a second frequency carrier, producing a third mixed signal;

means for mixing the real and imaginary signal components with a negative of said second frequency carrier, producing a fourth mixed signal;

means for mixing said third mixed signal with said fourth mixed signal, resulting in a second mixed real part and a second mixed imaginary part;

means for scaling the second mixed imaginary part by a second loop gain constant;

means for adding said scaled second mixed imaginary part to said phase control value, yielding an imaginary mixed sum; and means for accumulating said imaginary mixed sum, providing said phase control value.

4. A method of distortion compensation for phase and amplitude imbalance in zero-IF downconverters processing real and imaginary signal components, comprising the steps of:

first processing the real and imaginary signal components to produce a gain control value;

second processing the real and imaginary signal components to produce a phase control value; and coupling, responsive to said steps of processing, said gain and phase control values to the zero-IF downconverter, wherein said first step of processing further comprises the steps of:

squaring a sum of the real and imaginary signal components, producing a squared real part and a squared imaginary part;

scaling the squared real part by a first loop gain constant;

adding said scaled squared real part to said gain control value, yielding a real squared sum; and accumulating said real squared sum, providing said gain control value.

5. A method of distortion compensation for phase and amplitude imbalance in zero-IF downconverters processing real and imaginary signal components, comprising the steps of:

first processing the real and imaginary signal components to produce a gain control value;

second processing the real and imaginary signal components to produce a phase control value; and coupling, responsive to said steps of processing, said gain and phase control values to the zero-IF downconverter, wherein said second step of processing further comprises the steps of:

squaring a sum of the real and imaginary signal components, producing a squared real part and a squared imaginary part;

scaling the squared imaginary part by a second loop gain constant;

adding said scaled squared imaginary part to said phase control value, yielding an imaginary squared sum; and accumulating said imaginary squared sum, providing said phase control value.

6. A method of distortion compensation for phase and amplitude imbalance in zero-IF downconverters processing real and imaginary signal components, comprising the steps of:

first processing the real and imaginary signal components to produce a gain control value;

second processing the real and imaginary signal components to produce a phase control value; and coupling, responsive to said steps of processing, said gain and phase control values to the zero-IF downconverter.

wherein said first step of processing further comprises the steps of:

mixing the real and imaginary signal components with a first frequency carrier, producing a first mixed signal;

mixing the real and imaginary signal components with a negative of said first frequency carrier, producing a second mixed signal;

mixing said first mixed signal with said second mixed signal, resulting in a first mixed real part and a first mixed imaginary part;

scaling the first mixed real part by a first loop gain constant;

adding said scaled first mixed real part to said gain control value, yielding a real mixed sum; and accumulating said real mixed sum, providing said gain control value;

and wherein said second step of processing further comprises the steps of;

mixing the real and imaginary signal components with a second frequency carrier, producing a third mixed signal;

mixing the real and imaginary signal components with a negative of said second frequency carrier, producing a fourth mixed signal;

mixing said third mixed signal with said fourth mixed signal, resulting in a second mixed real part and a second mixed imaginary part;

scaling the second mixed imaginary part by a second loop gain constant;

adding said scaled second mixed imaginary part to said phase control value, yielding an imaginary mixed sum; and accumulating said imaginary mixed sum, providing said phase control value.

7. A distortion compensator for phase and amplitude imbalance in a zero-IF downconverter processing real and imaginary signal components, comprising:

means for multiplying the real signal component by a first gain value, producing a corrected real component;

means for multiplying the real signal component by a second gain value, yielding a scaled real component;

means for adding said scaled real component to the imaginary signal component, providing a compensated imaginary component; and means for processing said corrected real component and said compensated imaginary component to drive said first gain value and said second gain value.

8. The distortion compensator of claim 7 wherein said means for processing further comprises:

means for squaring a sum of said corrected component and said compensated imaginary component, producing a squared real part and a squared imaginary part;

means for scaling the squared real part by a first loop gain constant;

means for adding said scaled squared real part to said first gain value, yielding a real squared sum; and means for accumulating said real squared sum, providing said first gain value.

9. The distortion compensator of claim 7 wherein said means for processing further comprises:

means for squaring a sum of said corrected real component and said compensated imaginary component, producing a squared real part and a squared imaginary part;

means for scaling the squared imaginary part by a second loop gain constant;

means for adding said scaled squared imaginary part to said second gain value, yielding an imaginary squared sum; and means for accumulating said imaginary squared sum, providing said second gain value.

10. The distortion compensator of claim 7 wherein said means for processing further comprises:

means for mixing said corrected real component and said compensated imaginary component with a frequency carrier, producing a first mixed signal;

means for mixing the real and imaginary signal components with a negative of said frequency carrier, producing a second mixed signal;

means for mixing said first mixed signal with said second mixed signal, resulting in a mixed real part and a mixed imaginary part;

means for scaling the mixed real part by a first loop gain constant;

means for adding said scaled mixed real part to said first gain value, yielding a real mixed sum; and means for accumulating said real mixed sum, providing said first gain value.

11. The distortion compensator of claim 7 wherein said means for processing further comprises:

means for mixing said corrected real component and said compensated imaginary component with a frequency carrier, producing a first mixed signal;

means for mixing the real and imaginary signal components with a negative of said frequency carrier, producing a second mixed signal;

means for mixing said first mixed signal with said second mixed signal, resulting in a mixed real part and a mixed imaginary part;

means for scaling the mixed imaginary part by a second loop gain constant;

means for adding said scaled mixed imaginary part to said second gain value, yielding an imaginary mixed sum; and means for accumulating said imaginary mixed sum, providing said second gain value.

12. A method of distortion compensation for phase and amplitude imbalance in a zero-IF downconverter processing real and imaginary signal components, comprising the steps of:

multiplying the real signal component by a first gain value, producing a corrected real component;

multiplying the real signal component by a second gain value, yielding a scaled real component;

adding said scaled real component to the imaginary signal component, providing a compensated imaginary component; and processing said corrected real component and said compensated imaginary component to derive said first gain value and said second gain value.

13. The method of distortion compensation of claim 12 wherein said step of processing further comprises the steps of:

squaring a sum of said corrected real component and said compensated imaginary component producing a squared real part and a squared imaginary part;

scaling the squared real part by a first loop gain constant;

adding said scaled squared real part to said first gain value, yielding a real squared sum; and accumulating said real squared sum, providing said first gain value.

14. The method of distortion compensation of claim 12 wherein said step of processing further comprises the steps of:

squaring a sum of said corrected real component and said compensated imaginary component producing a squared real part and a squared imaginary part;

scaling the squared imaginary part by a second loop gain constant;

adding said scaled squared imaginary part to said second gain value, yielding an imaginary squared sum; and accumulating said imaginary squared sum, providing said second gain value.

15. The method of distortion compensation of claim 12 wherein said step of processing further comprises the steps of:

mixing said corrected real component and said compensated imaginary component with a frequency carrier, producing a first mixed signal;

mixing the real and imaginary signal components with a negative of said frequency carrier, producing a second mixed signal;

mixing said first mixed signal with said second mixed signal, resulting in a mixed real part and a mixed imaginary part;

scaling the mixed real part by a first loop gain constant;

adding said scaled mixed real part to said first gain value, yielding a real mixed sum; and accumulating said real mixed sum, providing said first gain value.

16. The method of distortion compensation of claim 12 wherein said step of processing further comprises the steps of:

mixing said corrected real component and said compensated imaginary component with a frequency carrier, producing a first mixed signal;

mixing the real and imaginary signal components with a negative of said frequency carrier, producing a second mixed signal;

mixing said first mixed signal with said second mixed signal, resulting in a mixed real part and a mixed imaginary part;

scaling the mixed imaginary part by a second loop gain constant;

adding said scaled mixed imaginary part to said second gain value, yielding an imaginary mixed sum; and accumulating said imaginary mixed sum, providing said second gain value.

17. A radio receiver employing a zero-IF downconverter, comprising:

means for converting a received signal into a real and an imaginary signal component;

a first means for processing said real and imaginary signal components to produce a gain control value;

a second means for processing said real and imaginary signal components to produce a phase control value; and means for coupling said gain and phase control values to the zero-IF downconverter, wherein said first means for processing further comprises;

means for squaring a sum of the real and imaginary signal components, producing a squared real part and a squared imaginary part;

means for scaling the squared real part by a first loop gain constant;

means for adding said scaled squared real part to said gain control value, yielding a real squared sum; and means for accumulating said real squared sum, providing said gain control value.

18. A radio receiver employing a zero-IF downconverter, comprising:

means for converting a received signal into a real and an imaginary signal component;

a first means for processing said real and imaginary signal components to produce a gain control value;

a second means for processing said real and imaginary signal components to produce a phase control value; and means for coupling said gain and phase control values to the zero-IF downconverter, wherein said second means for processing further comprises:

means for squaring a sum of the real and imaginary signal components, producing a squared real part and a squared imaginary part;

means for scaling the squared imaginary part by a second loop gain constant;

means for adding said scaled squared imaginary part to said phase control value, yielding an imaginary squared sum; and means for accumulating said imaginary squared sum, providing said phase control value.

19. A radio receiver employing a zero-IF downconverter, comprising:

means for converting a received signal into a real and an imaginary signal component;

a first means for processing said real and imaginary signal components to produce a gain control value;

a second means for processing said real and imaginary signal components to produce a phase control value; and means for coupling said gain and phase control values to the zero-IF downconverter;

wherein said first means for processing further comprises:

means for mixing the real and imaginary signal components with a first frequency carrier, producing a first mixed signal;

means for mixing the real and imaginary signal components with a negative of said first frequency carrier, producing a second mixed signal;

means for mixing said first mixed signal with said second mixed signal, resulting in a first mixed real part and a first mixed imaginary part;

means for scaling the first mixed real part by a first loop gain constant;

means for adding said scaled first mixed real part to said gain control value, yielding a real mixed sum; and means for accumulating said real mixed sum, providing said gain control value;

and wherein said second means for processing further comprises;

means for mixing the real and imaginary signal components with a second frequency carrier, producing a third mixed signal;

means for mixing the real and imaginary signal components with a negative of said second frequency carrier, producing a fourth mixed signal;

means for mixing said third mixed signal with said fourth mixed signal, resulting in a second mixed real part and a second mixed imaginary part;

means for scaling the second mixed imaginary part by a second loop gain constant;

means for adding said scaled second mixed imaginary part to said phase control value, yielding an imaginary mixed sum; and means for accumulating said imaginary mixed sum, providing said phase control value.

20. A radio receiver employing a zero-IF downconverter, comprising:

means for converting a received signal into a real and an imaginary signal component;

means for multiplying said real signal component by a first gain value, producing a corrected real component;

means for multiplying said real signal component by a second gain value, yielding a scaled real component;

means for adding said scaled real component to said imaginary signal component, providing a compensated imaginary component; and means for processing said corrected real component and said compensated imaginary component to derive said first gain value and said second gain value.

21. The radio receiver of claim 20 wherein said means for processing further comprises:
   means for squaring a sum of said corrected real component and said compensated imaginary component, producing a squared real part and a squared imaginary part;
   means for scaling the squared real part by a first loop gain constant;
   means for adding said scaled squared real part to said first gain value, yielding a real squared sum; and
   means for accumulating said real squared sum, providing said first gain value.

22. The radio receiver of claim 20 wherein said means for processing further comprises:
   means for squaring a sum of said corrected real component and said compensated imaginary component, producing a squared real part and a squared imaginary part;
   means for scaling the squared imaginary part by a second loop gain constant;
   means for adding said scaled squared imaginary part to said second gain value, yielding an imaginary squared sum; and
   means for accumulating said imaginary squared sum, providing said second gain value.

23. The radio receiver of claim 20 wherein said means for processing further comprises:
   means for mixing said corrected real component and said compensated imaginary component with a frequency carrier, producing a first mixed signal;
   means for mixing the real and imaginary signal components with a negative of said frequency carrier, producing a second mixed signal;
   means for mixing said first mixed signal with said second mixed signal, resulting in a mixed real part and a mixed imaginary part;
   means for scaling the mixed real part by a first loop gain constant;
   means for adding said scaled mixed real part to said first gain value, yielding a real mixed sum; and
   means for accumulating said real mixed sum, providing said first gain value.

24. The radio receiver of claim 20 wherein said means for processing further comprises:
   means for mixing said corrected real component and said compensated imaginary component with a frequency carrier, producing a first mixed signal;
   means for mixing the real and imaginary signal components with a negative of said frequency carrier, producing a second mixed signal;
   means for mixing said first mixed signal with said second mixed signal, resulting in a mixed real part and a mixed imaginary part;
   means for scaling the mixed imaginary part by a second loop gain constant;
   means for adding said scaled mixed imaginary part to said second gain value, yielding an imaginary mixed sum; and
   means for accumulating said imaginary mixed sum, providing said second gain value.

* * * * *

UNITED STATES PATENT AND TRADEMARK OFFICE
CERTIFICATE OF CORRECTION

PATENT NO. : 5,263,196

DATED : November 16, 1993

INVENTOR(S) : Steven C. Jasper

It is certified that error appears in the above-identified patent and that said Letters Patent is hereby corrected as shown below:

In Claim 6, Col. 8, line 43, replace "." with --,--.

Signed and Sealed this

Tenth Day of May, 1994

*Attest:*

BRUCE LEHMAN

*Attesting Officer*   Commissioner of Patents and Trademarks